US005493541A

United States Patent [19]

Snyder

[11] Patent Number: 5,493,541

[45] Date of Patent: Feb. 20, 1996

[54] ULTRASONIC TRANSDUCER ARRAY HAVING LASER-DRILLED VIAS FOR ELECTRICAL CONNECTION OF ELECTRODES

[75] Inventor: Jonathan E. Snyder, Whitefish Bay, Wis.

[73] Assignee: General Electric Company, Milwaukee, Wis.

[21] Appl. No.: 367,408

[22] Filed: Dec. 30, 1994

[51] Int. Cl.$^{6}$ .......................... H04R 17/00; H01L 41/04

[52] U.S. Cl. .......................... 367/155; 367/140; 310/334; 310/336; 310/365; 310/366

[58] Field of Search .......................... 367/140, 155; 310/334, 336, 365, 366

[56] References Cited

U.S. PATENT DOCUMENTS

| | | | |
|---|---|---|---|
| 4,890,268 | 12/1989 | Smith et al. | 367/155 |
| 5,045,746 | 9/1991 | Wersing et al. | 310/334 |
| 5,164,920 | 11/1992 | Bast et al. | 367/155 |
| 5,267,221 | 11/1993 | Miller et al. | 367/155 |
| 5,281,888 | 1/1994 | Takeuchi et al. | 310/366 |
| 5,329,496 | 7/1994 | Smith | 367/155 |
| 5,376,857 | 12/1994 | Takeuchi et al. | 310/365 |
| 5,381,385 | 1/1995 | Greenstein | 367/155 |

*Primary Examiner*—Charles T. Jordan
*Assistant Examiner*—Theresa M. Wesson
*Attorney, Agent, or Firm*—Dennis M. Flaherty; John H. Pilarski

[57] ABSTRACT

A system and process for electrically connecting all elements in a transducer array from one side. A flat block of piezoelectric ceramic material is patterned and drilled with a high-powered laser. The drilling is precisely controlled to define a series of vias which penetrate the ceramic block in the thickness direction. These vias facilitate electrical connection from one side of the ceramic block to the other side when the vias are sputtered or plated with electrically conductive material. In this way the electrodes on the front face of the transducer elements can be electrically connected from the rear to common ground or a signal source.

20 Claims, 5 Drawing Sheets

ULTRASONIC TRANSDUCER ARRAY HAVING LASER-DRILLED VIAS FOR ELECTRICAL CONNECTION OF ELECTRODES

FIELD OF THE INVENTION

This invention generally relates to ultrasound probes having an array of piezoelectric transducer elements. In particular, the invention relates to systems for making electrical connections to piezoelectric transducer elements.

BACKGROUND OF THE INVENTION

A typical ultrasound probe consists of three basic parts: (1) a transducer package; (2) a multi-wire coaxial cable connecting the transducer to the rest of the ultrasound system; and (3) other miscellaneous mechanical hardware such as the probe housing, potting material and electrical shielding. The transducer package is typically produced by stacking layers in sequence, as shown in FIG. 1.

First, a flexible printed circuit board 2 (hereinafter referred to the "transducer flex circuit"), having a plurality of conductive traces connected in common to an exposed bus, is bonded to a metal-coated rear face of a large piezoelectric ceramic block 4. The bus of the transducer flex circuit 2 is bonded and electrically coupled to the metal-coated rear face of the piezoelectric ceramic block. In addition, a conductive foil 10 is bonded to a metal-coated front face of the piezoelectric ceramic block to provide a ground path for the ground electrodes of the final transducer array. The conductive foil must be sufficiently thin to be acoustically transparent, that is, to allow ultrasound emitted from the front face of the piezoelectric ceramic block to pass through the foil without significant attenuation. The conductive foil extends beyond the area of the transducer array 4 and is connected to electrical ground.

Next, a first acoustic impedance matching layer 12 is bonded to the conductive foil 10. This acoustic impedance matching layer has an acoustic impedance less than that of the piezoelectric ceramic. Optionally, a second acoustic impedance matching layer 14 having an acoustic impedance less than that of the first acoustic impedance matching layer 12 is bonded to the front face of the first matching layer 14. The acoustic impedance matching layers transform the high acoustic impedance of the piezoelectric ceramic to the low acoustic impedance of the human body and water, thereby improving the coupling with the medium in which the emitted ultrasonic waves will propagate.

To fabricate a linear array of piezoelectric transducer elements, the top portion of this stack is then "diced" by sawing vertical cuts, i.e., kerfs, from the rear face of the stack to a depth sufficient to divide the piezoelectric ceramic block into a multiplicity of separate side-by-side transducer elements. The kerfs produced by this dicing operation are depicted in FIG. 2. During dicing, the bus of the transducer flex circuit 2 (not shown in FIG. 2) is cut to form separate terminals and the metal-coated rear and front faces of the piezoelectric ceramic block are cut to form separate signal and ground electrodes respectively. Electrically and acoustically isolated, the individual elements can now function independently in the array. Although the conductive foil (also not shown in FIG. 2) is also cut into parallel strips, these strips are connected in common to the conductive foil portion which extends beyond the transducer array 4, which conductive foil portion forms a bus which is connected to ground. Alternatively, the transducer flex circuit 2 can be formed with individual terminals instead of a bus and then bonded to the piezoelectric transducer array 4 after dicing.

The transducer stack also comprises a mass of suitable acoustical damping material having high acoustic losses. This backing layer 8 is coupled to the rear surface of the piezoelectric transducer elements to absorb ultrasonic waves that emerge from the back side of each element so that they will not be partially reflected and interfere with the ultrasonic waves propagating in the forward direction.

A known technique for electrically connecting the piezoelectric elements of a transducer stack to a multi-wire coaxial cable is by a flexible printed circuit board (PCB) having a plurality of etched conductive traces extending from a first terminal area to a second terminal area in which the conductive traces fan out, i.e., the terminals in the first terminal area have a linear pitch greater than the linear pitch of the terminals in the second terminal area. The terminals in the first terminal areas are respectively connected to the individual wires of the coaxial cable. The terminals in the second terminal areas are respectively connected to the signal electrodes of the individual piezoelectric transducer elements.

One approach for connecting a flexible PCB to a piezoelectric transducer array is a variation of a known high-density interconnect process originally developed for integrated circuit packaging and disclosed in U.S. Pat. No. 5,091,893. Using this technique, a flexible PCB can be fabricated with one end directly connected to a transducer array. To accomplish this, the transducer array is placed in a well formed in a frame with the metallized piezoceramic exposed. An insulating polyimide film is laminated to the surface of the metallized piezoceramic and the surrounding frame, creating a relatively flat surface. A computer-controlled laser then ablates holes in the polyimide layer down to the metal electrode atop the ceramic. A metal layer is applied over the film and follows the hole contour, thereby making electrical contact with the metal electrodes on the ceramic. Conventional photolithographic techniques (25 μm lines and spaces are typical) are used to pattern the metal, thus creating lines from each transducer element to a fanout pattern. The process can be repeated to produce multilayered structures. Excess polyimide can be removed to provide a good acoustic contact of the backing to the ceramic element.

The above-described high-density interconnect system allows the transducer designer to interconnect elements at a considerably higher density than standard manual soldering or flexible PCB technology. This is particularly useful when the transducer design requires fine-pitch, high-frequency operation.

As the system demands on element count in these devices increase, the requirements for making electrical connection to new complex transducer geometries approach the point of being insurmountable. One of the most difficult tasks is the process of connecting signal ground to the front face of the transducer piezoelectric ceramic.

In particular, the density requirements of the transducer array are challenged by the transducers needed for multi-dimensional imaging. These transducers require elements in two dimensions, instead of the one-dimensional designs required by conventional imaging apparatus. When the electrical interconnect becomes two-dimensional, however, the designer is faced with the challenge of providing an electrical interconnect for transducer elements which are no longer accessible from the sides of the array, which is a feature common to most conventional transducer designs. In order to connect the internal elements, complicated methods have been proposed and developed.

SUMMARY OF THE INVENTION

The present invention is a process for electrically connecting all elements in a one- or two-dimensional transducer array from one side, thereby simplifying the design and construction of this type of transducer. This process is designed to alleviate the difficulties associated with electrical interconnection of an ultrasonic transducer array.

In accordance with a preferred embodiment of the invention, the transducer element ground electrode is connected to common ground from the rear, using the technologies of laser drilling and sputtered or plated vias. By utilizing semiconductor and printed circuit board technologies, a complete electrical interconnection for an ultrasonic transducer can be constructed from one side of the active element, thereby simplifying the manufacture of complex, multi-element transducer arrays.

The process of the invention utilizes the concepts of the high-density interconnect system and high-powered laser drilling of ceramic, which is the most commonly used material in piezoelectric devices. A flat block of the ceramic material is patterned and drilled with a high-powered laser. The drilling is precisely controlled to define a series of vias which penetrate the ceramic block in the thickness direction. These vias facilitate electrical connection from one side of the ceramic block to the other side when the vias are sputtered or plated with electrically conductive material.

In accordance with the preferred embodiment of the invention, each laser-drilled via has the shape of a truncated cone, with the larger-diameter end of the truncated cone being located at the rear face of the ceramic block. The vias are formed after the front face of the piezoelectric ceramic block has been sputtered or plated to form a pattern of front electrodes. The piezoelectric ceramic block is then laminated to an acoustic impedance matching layer. The vias expose the front electrodes. After the vias have been formed, the rear face of the piezoelectric ceramic block is sputtered or plated to form the rear electrodes. The conical surface of the via is also covered with a layer of electrically conductive material during the sputtering or plating. The via is sputtered from the larger-diameter end of the cone. As a result of this process, the rear electrodes are electrically connected to the front electrodes by means of the electrically conductive material coating the conical surface of the via.

In accordance with a further aspect of the invention, masking technology or photolithographic techniques can be used to form the electrodes on the rear surface of the ceramic. In particular, a pattern can be formed on the rear surface whereby an annular electrical isolation zone separates an annular portion of a ground electrode which surrounds the periphery of the large-diameter end of each via and a respective signal electrode.

In this way a pair of electrodes, one directly coupled to the ceramic rear surface and the other coupled to the ceramic front face by means of the via through the ceramic, can be deposited on one side of the array element. Then high-density connect technology can be used to build a flexible PCB on the rear surface of the ceramic for bringing both poles of the electrical interconnect out to the main coaxial cable interface. A backing layer of acoustic damping material which fills the vias is then formed on the rear surface.

The resulting transducer stack is cut into individual elements using conventional dicing technology, thereby creating individual transducer elements, each having positive and negative electrical connections on the rear face of the transducer and an electrically coated via wall for electrically connecting the negative electrical connection on the rear face with an electrical connection on the front face. Using the process in accordance with the present invention, one- and two-dimensional arrays of piezoelectric transducer elements can be fabricated without complex electrical interconnections.

DETAILED DESCRIPTION OF THE PREFERRED EMBODIMENTS

Figure 1:
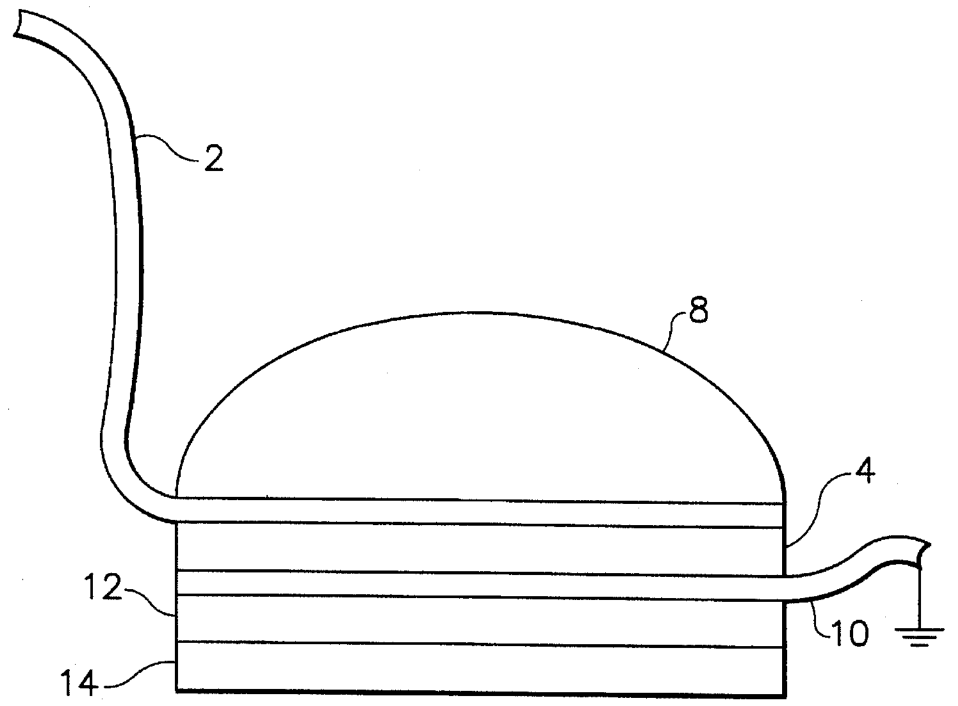
FIG. 1 is a schematic end view of a conventional transducer stack having a flexible printed circuit board connected to the signal electrodes of the transducer elements and having a conductive film connected to the ground electrodes of the transducer elements.
Figure 2:
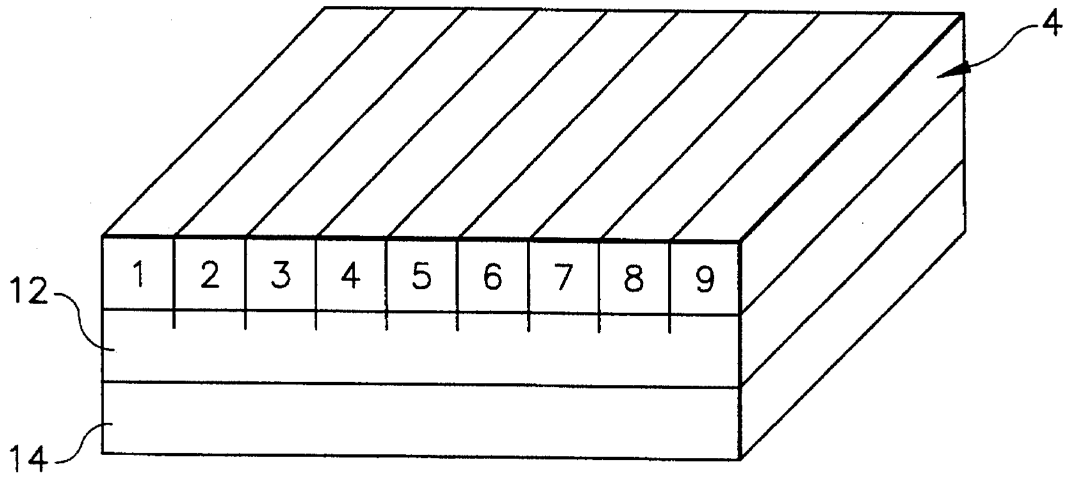
FIG. 2 is a schematic isometric view of a typical transducer stack after dicing.
Figure 3:
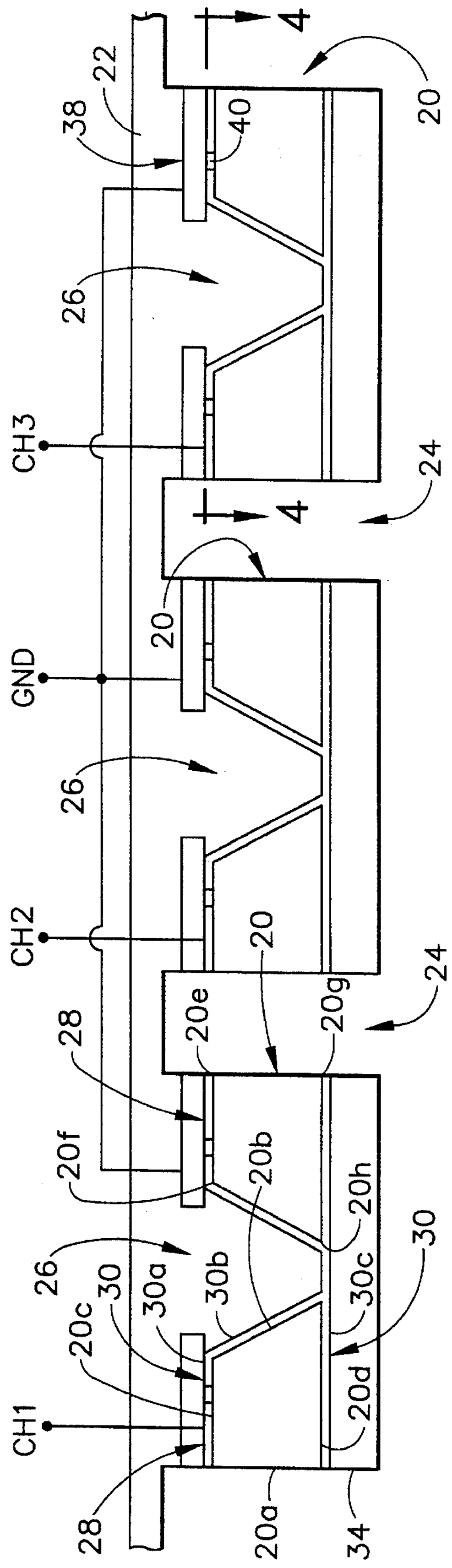
FIG. 3 is a schematic diagram showing a portion of a one-dimensional transducer array constructed in accordance with a first preferred embodiment of the invention.
Figure 4:
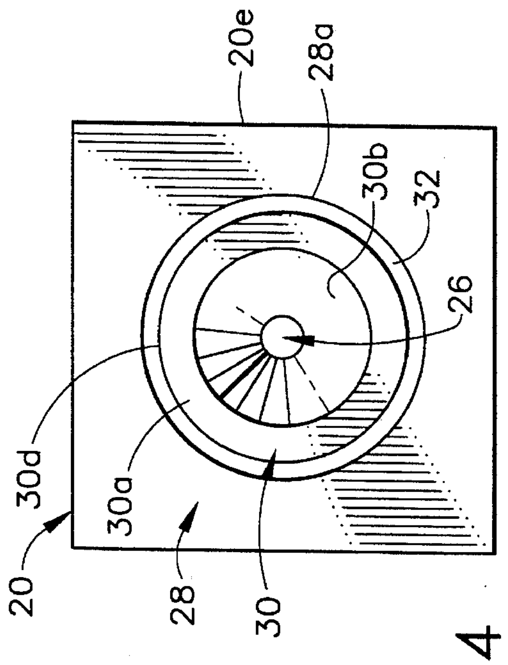
FIG. 4 is a schematic top view of a single element of the transducer array depicted in FIG. 3, with the backing layer and flexible PCB removed.
Figure 5:
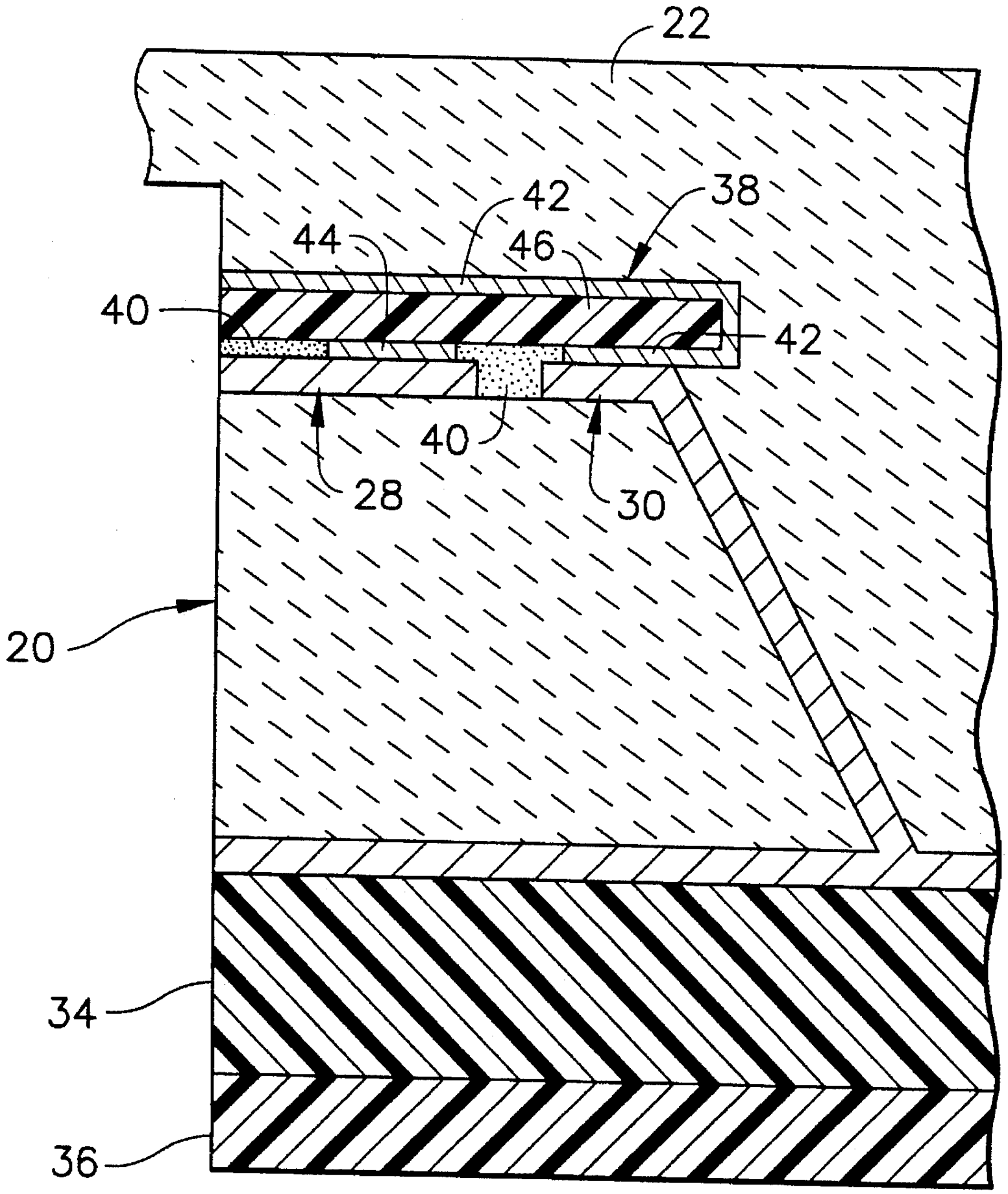
FIG. 5 is a schematic diagram showing further details of the electrode arrangement in the transducer elements for the transducer array shown in FIG. 3.

Referring to FIGS. 3–5, a one-dimensional ultrasonic transducer array in accordance with a preferred embodiment of the invention comprises a row of transducer elements 20. The transducer elements 20 are identical in structure and are supported in a planar arrangement by a backing layer 22 made of acoustic damping material. Adjacent transducer elements are separated by kerfs 24, whereby the piezoelectric ceramic element is electrically and acoustically isolated from its neighbors.

Each transducer element 20 has an outer periphery **20*a* defined by the kerfs on four sides and an inner periphery 20*b* (hereinafter referred to as "via wall 20*b*") defined by a via 26 which passes through transducer element 20 from the rear face 20*c* to the front face 20*d*. The rear face 20*c* is shown in FIG. 4 as being a surface area having a square outer perimeter 20*e* and a circular inner perimeter 20*f*, with the centroid of the square and the center of the inner circle being a common point. The front face 20*d* (not shown in FIG. 4) has a geometry similar to that of the rear face 20*c*, namely, a square outer perimeter 20*g* and a circular inner perimeter 20*h*. Outer perimeter 20*g* of front face 20*d* has the same dimension as outer perimeter 20*e* of rear face 20*c*; inner perimeter 20*h* of front face 20*d* has a diameter which is less than the diameter of inner perimeter 20*f* of rear face 20*c*. The via 26 is an opening which extends from the circular inner perimeter 20*f* of the rear face to the circular inner perimeter 20*h* of the front face. The preferred shape of via 26 is a truncated cone. The diameter of conical via wall 20***b* decreases with increasing depth, preferably linearly.

Referring to FIG. 5, a flexible PCB 38 is laminated to the rear faces of the transducer elements 20 using adhesive 40. The flexible PCB has apertures which overlie the corresponding vias 26. Each transducer element 20 has a signal electrode 28 electrically connected to a signal electrode 44 formed on the front face of an insulating substrate 46 of flexible PCB 38. Each transducer element 20 also has a ground electrode 30 electrically connected to a ground electrode 42 formed on insulating substrate 46. As shown in FIG. 5, the ground electrode 42 extends from the front face to the rear face of the insulating substrate 46.

The ground electrode 42 is in turn connected to common ground, while the signal electrode 44 is in turn connected to a corresponding transducer channel (e.g., CH1 in FIG. 3). Although electrical connections between the signal and ground electrodes of the flexible PCB 38 and the transducer channels and common ground are depicted schematically in FIG. 3 as passing through the backing layer 22 to simplify the drawing, in practice electrodes 42 and 44 will be connected to leads at the edge of the flexible circuit board which do not pass through the backing layer.

As seen in FIG. 4, the signal electrode 28 is a layer of electrically conductive material which covers a portion of the surface area of rear face 20*c*. More specifically, the coated surface area corresponding to signal electrode 28 has a square outer perimeter which is the same as the square outer perimeter 20*e* of rear face 20*c* and a circular inner perimeter 28*a* which is concentric with and of greater diameter than circular inner perimeter 20*f* of rear face 20*c*.

The ground electrode 30 is comprised of a first layer 30*a* of electrically conductive material which covers a portion of the surface area of rear face 20*c*, a second layer 30*b* of electrically conductive material which covers the entire surface area of via wall 20*b*, and a third layer 30*c* of electrically conductive material which covers the entire surface area of front face 20*d*. The first layer 30*a* of electrically conductive material is contiguous with the second layer 30*b* of electrically conductive material along the circular inner perimeter 20*f* of rear face 20*c*; the second layer 30*b* of electrically conductive material is contiguous with the third layer 30*c* of electrically conductive material along the circular inner perimeter 20*h* of front face 20*d*. As seen in FIG. 4, the first layer 30*a* of electrically conductive material is an annulus having a circular inner perimeter of diameter equal to the diameter of inner perimeter 20*f* of rear face 20*c* and having a circular outer perimeter 30*d* of diameter which is less than the diameter of the circular inner perimeter 28*a* of signal electrode 28. The outer perimeter 30*d* of ground electrode 30 and the inner perimeter 28*a* of signal electrode 28 define an annular zone 32 on rear face 20*c* which is not coated with electrically conductive material. Thus, annular zone 32 electrically isolates the ground electrode from the signal electrode.

Although in accordance with the one-dimensional embodiment, electrode 28 is connected to the signal source and electrode 30 is connected to ground, this is not necessary. In the alternative, electrode 28 could be connected to ground and electrode 30 could be connected to the signal source. In either case, the electrode 30 consists of a layer of electrically conductive material sufficiently thin to be acoustically transparent to the ultrasonic waves produced by the transducer element.

The front face 20*d* of each transducer element has an acoustic impedance matching layer 34 bonded thereto. This acoustic impedance matching layer has an acoustic impedance less than that of the piezoelectric ceramic. Alternatively, as shown in FIG. 5, a second acoustic impedance matching layer 36 can be laminated to acoustic impedance matching layer 34.

In accordance with the method for manufacturing the one-dimensional embodiment of the invention, an electrode pattern is formed on the front face of a flat block of piezoelectric ceramic material using conventional techniques. An acoustic impedance matching layer is laminated to the front face of the flat block. The block of piezoelectric ceramic is then patterned and drilled with a high-powered laser starting from the rear face. The drilling is precisely controlled to define a series of spaced vias which penetrate the ceramic block in the thickness direction to a depth whereby the electrodes on the front face of the piezoelectric ceramic are exposed at the bottom of the via. Then the rear face of the piezoelectric block and the via walls are coated with a layer of electrically conductive material, except for a plurality of electrical isolation zones where no electrically conductive material is deposited. Each electrical isolation zone encircles a corresponding one of the plurality of vias. The electrically conductive coatings may be applied on the rear face of the piezoelectric ceramic block and on the wall of each via by any conventional means, e.g., sputtering or plating. The electrical isolation zones on the rear face of the piezoelectric ceramic block may also be formed by any conventional means, e.g., masking. Then a flexible PCB is built on or laminated to the back of the piezoelectric ceramic block. Then acoustic damping material is used to fill the vias and form the backing layer on top of the flexible PCB. Then a plurality of kerfs are formed using conventional dicing technology. The kerfs divide the block into a plurality of electrically and acoustically isolated ultrasonic transducer elements. The kerfs are located so that each transducer element comprises one via for electrically connecting the front and rear faces and one electrical isolation zone for electrically isolating the signal and ground electrodes.

As shown in FIGS. 3–5, ground electrodes 30 of a piezoelectric transducer array in accordance with the invention have a layer of conductive material 30*a* deposited on the rear face 20*c* of the piezoelectric ceramic element 20. Layer 30*a* is electrically connected to a layer of conductive material 30*c* deposited on the front face 20*d* by way of a layer of conductive material 30*b* deposited on the conical via wall 20*b*. The formation of vias which penetrate from the rear face to the front face facilitates connection of ground electrodes to probe common ground for transducer elements of a one-dimensional array. However, the invention can also be used to construct two-dimensional arrays of transducer elements in which interior transducer elements are otherwise inaccessible.

Figure 6:
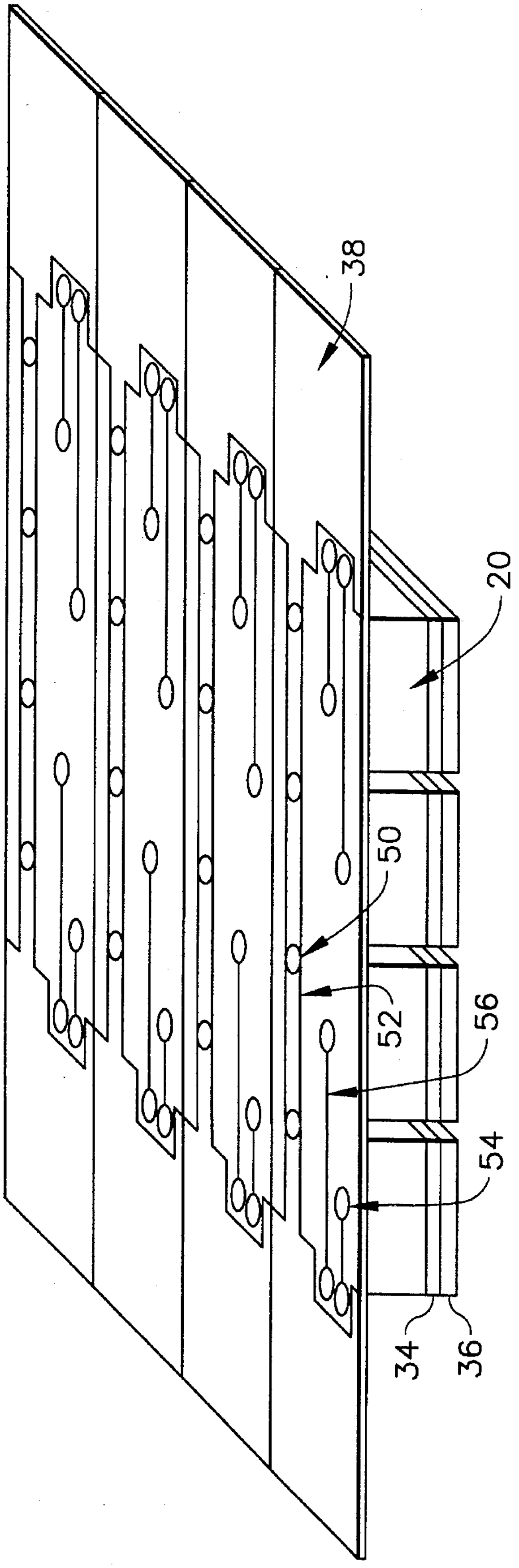
FIG. 6 is an isometric view showing a portion of a two-dimensional transducer array constructed in accordance with a second preferred embodiment of the invention.
Figure 7:
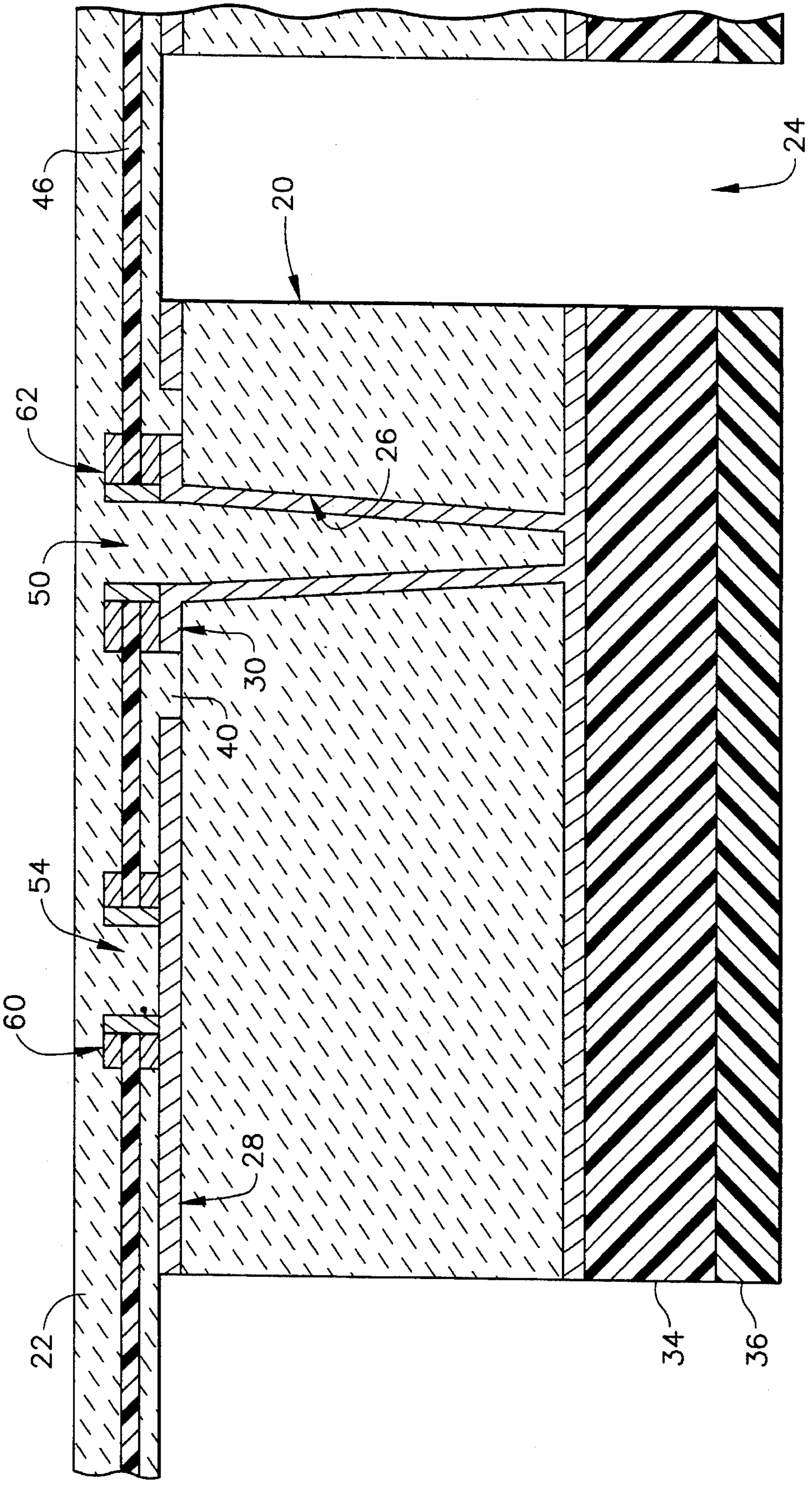
FIG. 7 is a schematic diagram showing further details of the electrode arrangement in the transducer elements for the transducer array shown in FIG. 6.

Referring to FIGS. 6 and 7, a two-dimensional array of transducer elements can be constructed using the technique for manufacturing a one-dimensional array coupled with a further improvement to enable electrical connection of the otherwise inaccessible signal electrodes of interior transducer elements. As best seen in FIG. 7, each transducer element 20 has a via 26 for electrically connecting the front and rear faces. For each transducer element, the flexible PCB 38 has a ground via 50 for electrically connecting ground electrode 30 to an annular ground electrode pad 62 formed on top of insulating substrate 46. As seen in FIG. 6, the pads 62 are connected by ground traces 52 to a probe common ground. In addition, the flexible PCB 38 has a signal via 54 for electrically connecting signal electrode 28 to an annular signal electrode pad 60 formed on top of insulating substrate 46 (see FIG. 7). As seen in FIG. 6, the pads 60 are connected via signal traces 54 to the ultrasound transmitter (not shown).

The foregoing preferred embodiments have been disclosed for the purpose of illustration. Variations and modifications which do not depart from the broad concept of the invention will be readily apparent to persons skilled in the design of ultrasonic transducers. For example, it will be apparent to skilled practitioners that the via may have a geometry different than a truncated cone and the electrical isolation zone between the signal and ground electrodes may have a geometry different than an annulus. In addition, it is not necessary that the entire via wall be coated with electrically conductive material, so long as the conductive material deposited on the via wall forms at least one continuous conductor extending between and electrically connected to respective portions of the ground electrode deposited on the rear and front faces. Finally, the present invention is directed to an electrode geometry that enables both the front and rear electrodes to be electrically connected from the rear. The scope of the invention should not be limited as to the circuitry to which the front and rear electrodes are respectively connected. In other words, whether the front electrode is connected to the signal source and the rear electrode is connected to ground or vice versa is of no consequence to the scope of the invention. All such variations and modifications are intended to be encompassed by the claims set forth hereinafter.

I claim:

1. An ultrasonic transducer element comprising:

a block of piezoelectric ceramic material having a rear face and a front face, wherein said block has a via which extends from said rear face to said front face, said via being defined by a via wall;

a first electrode having at least a portion thereof formed on said rear face; and a second electrode having a first portion formed on said front face, a second portion formed on said via wall and a third portion formed on said rear face, said first portion being contiguous with said second portion and said second portion being contiguous with said third portion, wherein said first electrode portion on said rear face and said second electrode portion on said rear face are electrically isolated from each other by an electrical isolation zone formed therebetween.

2. The ultrasonic transducer element as defined in claim 1, wherein said via wall has the shape of a truncated cone with a first diameter at said rear face and a second diameter at said front face, said first diameter being greater than said second diameter.

3. The ultrasonic transducer element as defined in claim 2, wherein said via wall intersects said rear face at a circular inner perimeter of said rear face, and said first portion of said second electrode consists of a coating of electrically conductive material deposited on an annulus extending radially outward from said circular inner perimeter of said rear face.

4. The ultrasonic transducer element as defined in claim 3, wherein said second portion of said second electrode consists of a coating of electrically conductive material deposited on said via wall, said first and second portions of said second electrode being contiguous along said circular inner perimeter of said rear face.

5. The ultrasonic transducer element as defined in claim 3, wherein said electrical isolation zone is in the shape of an annulus adjacent to and concentric with said first portion of said second electrode.

6. The ultrasonic transducer element as defined in claim 2, wherein said via wall intersects said front face at a circular inner perimeter of said front face, said second portion of said second electrode consists of a coating of electrically conductive material deposited on said via wall, and said third portion of said second electrode consists of a coating of electrically conductive material deposited on said front face, said second and third portions of said second electrode being contiguous along said circular inner perimeter of said front face.

7. The ultrasonic transducer element as defined in claim 1, further comprising a backing layer made of acoustic damping material, said backing layer being acoustically coupled to said rear face of said block of piezoelectric ceramic material, wherein said via is filled with said acoustic damping material.

8. An ultrasonic transducer comprising a plurality of ultrasonic transducer elements and means for supporting said plurality of ultrasonic transducer elements in an array, wherein each of said ultrasonic transducer elements comprises:

a block of piezoelectric ceramic material having a rear face and a front face, wherein said block has a via which extends from said rear face to said front face, said via being defined by a via wall;

a first electrode having at least a portion thereof formed on said rear face; and a second electrode having a first portion formed on said front face, a second portion formed on said via wall and a third portion formed on said rear face, said first portion being contiguous with said second portion and said second portion being contiguous with said third portion, wherein said first electrode portion on said rear face and said second electrode portion on said rear face are electrically isolated from each other by an electrical isolation zone therebetween.

9. The ultrasonic transducer as defined in claim 8, wherein said array of ultrasonic transducer elements is one-dimensional.

10. The ultrasonic transducer as defined in claim 8, wherein said array of ultrasonic transducer elements is two-dimensional.

11. The ultrasonic transducer as defined in claim 8, wherein said via wall has the shape of a truncated cone with a first diameter at said rear face and a second diameter at said front face, said first diameter being greater than said second diameter.

12. The ultrasonic transducer as defined in claim 11, wherein said via wall intersects said rear face at a circular inner perimeter of said rear face, and said first portion of said second electrode consists of a coating of electrically conductive material deposited on an annulus extending radially outward from said circular inner perimeter of said rear face.

13. The ultrasonic transducer as defined in claim 12, wherein said second portion of said second electrode consists of a coating of electrically conductive material deposited on said via wall, said first and second portions of said second electrode being contiguous along said circular inner perimeter of said rear face.

14. The ultrasonic transducer as defined in claim 8, further comprising a backing layer made of acoustic damping material, said backing layer being acoustically coupled to said rear face of said block of piezoelectric ceramic material, wherein said via is filled with said acoustic damping material.

15. The ultrasonic transducer as defined in claim 14, further comprising a flexible circuit board sandwiched between said acoustic damping material on one side and said first electrode and said third portion of said second electrode on the other side.

16. A method for fabricating an ultrasonic transducer array comprising the steps of:

forming a plurality of spaced vias in a block of piezoelectric ceramic material, each via having a wall extending from a rear face to a front face of said block;

forming a plurality of electrical isolation zones on said rear face, each of said electrical isolation zones encircling the intersection of said rear face and said via wall;

depositing a layer of electrically conductive material on said rear face except at said plurality of electrical isolation zones;

depositing a layer of electrically conductive material on said front face;

depositing a layer of electrically conductive material on said via wall which is electrically connected to said layer of electrically conductive material on said rear face and to said layer of electrically conductive material on said front face; and forming a plurality of kerfs in said block to divide said block into a plurality of electrically and acoustically isolated ultrasonic transducer elements each comprising one via and one electrical isolation zone.

17. The method as defined in claim 16, wherein said step of forming a plurality of spaced vias comprises laser drilling.

18. The method as defined in claim 16, wherein said step of depositing a layer of electrically conductive material on said via wall comprises sputtering.

19. The method as defined in claim 16, wherein said via wall has the shape of a truncated cone with a first diameter at said rear face and a second diameter at said front face, said first diameter being greater than said second diameter.

20. The method as defined in claim 16, wherein each of said plurality of electrical isolation zones has the shape of an annulus.

* * * * *